(12) United States Patent
Guo

(10) Patent No.: US 6,878,583 B2
(45) Date of Patent: Apr. 12, 2005

(54) INTEGRATION METHOD TO ENHANCE P+ GATE ACTIVATION

(75) Inventor: Jyh Chyurn Guo, Hsinchu (TW)

(73) Assignee: Taiwan Semiconductor Manufacturing Company, Hsinchu (TW)

( * ) Notice: Subject to any disclaimer, the term of this patent is extended or adjusted under 35 U.S.C. 154(b) by 54 days.

(21) Appl. No.: 10/358,632

(22) Filed: Feb. 5, 2003

(65) Prior Publication Data

US 2004/0152253 A1 Aug. 5, 2004

(51) Int. Cl.$^7$ .................. H01L 21/8238; H01L 21/336; H01L 21/425; H01L 21/31
(52) U.S. Cl. .................. 438/231; 438/305; 438/526; 438/585; 438/529; 438/785
(58) Field of Search .................. 438/231, 216, 438/287, 305, 585, 529, 530, 785, 786, 226, 233, 586, 589, 303, 798, 683

(56) References Cited

U.S. PATENT DOCUMENTS

| | | | |
|---|---|---|---|
| 5,915,204 A | * 6/1999 | Sumi .......................... | 438/683 |
| 6,027,977 A | 2/2000 | Mogami ...................... | 438/287 |
| 6,051,460 A | 4/2000 | Nayak et al. ................ | 438/232 |
| 6,165,826 A | * 12/2000 | Chau et al. .................. | 438/231 |
| 6,242,348 B1 | 6/2001 | Kamal et al. ................ | 438/682 |
| 6,313,020 B1 | 11/2001 | Kim et al. ................... | 438/591 |
| 6,319,861 B1 | * 11/2001 | Shih et al. ................... | 438/798 |
| 6,323,094 B1 | * 11/2001 | Wu ............................. | 438/303 |
| 6,335,252 B1 | * 1/2002 | Oishi et al. ................. | 438/303 |
| 6,653,700 B1 | * 11/2003 | Chau et al. .................. | 257/412 |

* cited by examiner

*Primary Examiner*—John F. Niebling
*Assistant Examiner*—Ron Pompey
(74) *Attorney, Agent, or Firm*—Thomas, Kayden, Horstemeyer & Risley

(57) ABSTRACT

A new process integration method is described to form heavily doped p+ source and drain regions in a CMOS device. After defining the p- and n-well regions on a semiconductor substrate, gate silicon dioxide is deposited and nitrided in a nitrogen-containing atmosphere. Poly-silicon is then deposited and the two NMOS and PMOS gates are formed. For the p+ doping of the poly-silicon gate and S/D regions around the PMOS gate, B+ ions are then implanted. Cap dielectric layer comprising silicon dioxide is then deposited, followed by dopant activation with high temperature rapid thermal annealing. The cap dielectric layer is then used as resist protective film; it is removed from those areas of the chip that would require formation of electrical contacts. Silicide electrical contacts are then formed in these areas.

33 Claims, 3 Drawing Sheets

Comparision of Oxide Thickness* with Prior Art and Invention Process.

| Device & Oxide Type | Prior Art °A | Invention °A | Thickness Difference |
|---|---|---|---|
| Ellipsometric meas. | 36 | 35 | 1 |
| NMOS – accumulation | 41.7 | 38.3 | 3.4 |
| NMOS – inversion | 42.6 | 40.3 | 2.3 |
| PMOS – accumulation | 41.8 | – | – |
| PMOS – inversion | 46.8 | 42.3 | 4.5 |

(* oxide thickness measured electrically by CV method)

Comparision of Oxide Thickness* with Prior Art and Invention Process.

| Device & Oxide Type | Prior Art °A | Invention °A | Thickness Difference |
|---|---|---|---|
| Ellipsometric meas. | 36 | 35 | 1 |
| NMOS - accumulation | 41.7 | 38.3 | 3.4 |
| NMOS - inversion | 42.6 | 40.3 | 2.3 |
| PMOS - accumulation | 41.8 | - | - |
| PMOS - inversion | 46.8 | 42.3 | 4.5 |

(* oxide thickness measured electrically by CV method)

INTEGRATION METHOD TO ENHANCE P+ GATE ACTIVATION

BACKGROUND OF THE INVENTION (1) Field of the Invention

This invention relates generally to fabrication of a semiconductor device and more particularly to an integration method to enhance gate activation in a complimentary metal-oxide semiconductor (CMOS) device.

(2) Description of the Prior Art

There is a continuing trend to scale down the dimensions of a semiconductor device for purposes of enhancing device speed, density, and level of integration. In order to increase the speed of a CMOS device for example, channel length or poly-silicon gate width has been decreasing aggressively. Equivalent gate oxide thickness has to correspondingly get thinner to minimize or avoid short channel effects. However, as the gate oxide gets thinner, dopant ions used to increase the conductivity of poly-silicon gate tend to penetrate through the gate and into and through the thin gate oxide layer. This penetration causes device degradation such as large threshold voltage shifts and saturated current. Further, undesirable degradation of gate oxide integrity tends to get worse with thinning gate oxide. It turns out a trade-off exists between impurity penetration and carrier depletion for engineering gate doping.

It has therefore become necessary to increase the doping level in the gate to compensate for electron depletion. A pre-doping process has been used to increase the doping level; and this procedure significantly improves the depletion for the NMOS transistor of the CMOS device. However, in the case of PMOS transistor part, pre-doping increases boron ion penetration into the p-channel through the gate oxide thereby degrading the device properties. A conventional PMOS transistor gate structure typically consists of: a gate oxide layer on a silicon substrate, a dual gate conductor of poly-silicon layer on top of gate oxide and a metal suicide layer on top of poly-silicon. During the pre-doping process, a boron-implanted poly-silicon layer is formed and when thermally annealed boron ions from this layer diffuse along grain boundaries of the poly-silicon gate into the gate oxide and through the gate oxide into the channel region of the substrate.

When $BF_2^+$ ions are used to implant the p$^+$ gate of the transistor, followed by high temperature annealing, a significant ion penetration takes place since F atoms released in the implantation process enhance $BF_2^+$ ion diffusion. To prevent ion penetration, some solutions have been proposed in prior art such as, use of nitrided gate oxide, oxygen-doped nitride as gate dielectric, an electron depletion preventing layer under poly-silicon gate, or implanting nitrogen or silicon into the p$^+$ poly-silicon gate.

U.S. Pat. No. 6,027,977 describes a method of fabricating a device with MIS structure which prevents boron penetration even when the gate oxide is as thin as 3 nm or less. After forming a silicon nitride film on a semiconductor substrate, oxygen is doped into the nitride film such that oxygen-rich film is next to the substrate. A gate electrode is formed on the oxygen-doped silicon nitride film and a dopant is selectively introduced into the substrate to form source/drain regions on each side of the gate structure. When poly-silicon gate is doped with boron ions, the oxygen doped silicon nitride gate acts as a barrier to boron penetration, similar to a pure nitride gate dielectric film. Because of the oxygen-rich part of the dielectric film next to the semiconductor substrate, the trap density at the interface is almost as low as that of an undoped oxide dielectric film. Such is not the case when undoped nitride is used as a gate dielectric film.

U.S. Pat. No. 6,051,460 describes a structure and method for preventing boron penetration through a thin gate oxide of a p-channel device. Silicon implanted into the poly-silicon gate electrode functions as a diffusion barrier for boron penetration through the gate oxide into the device.

U.S. Pat. No. 6,242,348 B1 a method for the formation of a boron-doped gate layer under a cobalt silicide layer to prevent boron penetration. After forming a bilayer CoSi/poly-silicon/gate-oxide gate structure, $BF_2^+$ or $B^+$ and $N_2^+$ ions are implanted into the stack structure and thermally treated to form the cobalt silicide ($CoSi_2$). CoSi layer in the upper part of the gate stack serves as a barrier to significantly suppress boron penetration into and through the gate oxide.

U.S. Pat. No. 6,313,020 B1 describes a semiconductor device and a method of its fabrication. An electron depletion preventing layer is formed in the bottom portion of a poly-silicon gate. An ion-implanted layer of boron ions is then formed in the upper portion of the gate-conductor to increase its conductivity. This electron depletion preventing layer serves as a barrier to suppress boron penetration into the gate oxide.

SUMMARY OF THE INVENTION

It is a primary object of this invention to describe an integration method to enhance p$^+$ gate activation in a CMOS device.

Another object of the invention is to describe a method to form a p$^+$ gate without boron penetration into gate oxide.

It is yet another object to describe a method to simultaneously activate p$^+$ poly-silicon gate and source/drain regions, while suppressing boron penetration into gate oxide.

In accordance with these objectives, a new process integration method is described to form heavily doped p$^+$ source and drain regions in a CMOS device. After defining the p- and n-well regions on a semiconductor substrate, gate silicon dioxide is deposited and nitrided in a nitrogen-containing atmosphere of gases comprising $NH_3$, NO, and/or $NO_2$. Poly-silicon is then deposited over the nitrided gate dielectric layer and the two NMOS and PMOS gates are formed with anisotropic plasma etching processes. For the p$^+$ doping of the poly-silicon gate and S/D regions around the PMOS gate, B$^+$ ions are then implanted. Cap dielectric layer such as silicon dioxide is then deposited, followed by dopant activation with high temperature rapid thermal annealing. During this anneal step, both poly-silicon gate and source/drain regions are activated. The cap dielectric layer is then used as a resist protective film; it is removed from those areas of the chip that would require formation of electrical contacts. Silicided electrical contacts are then formed in these areas by silicidation processes.

DETAILED DESCRIPTION OF THE INVENTION

Although the process of this invention can be generally used for activating $p^+$ doped regions in a semiconductor device, the preferred embodiment described herein pertains to the $p^+$ gate activation of a CMOS device. The process steps up to the gate structure formation, being known in the prior art, are not included in this description.

Figure 1:
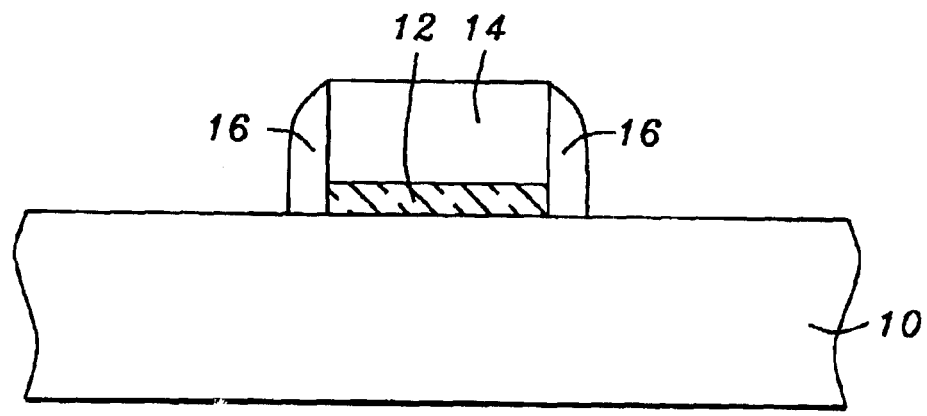
FIG. 1 is a cross sectional view of a semiconductor device, showing gate structure with sidewall dielectric spacers.

The gate structure, shown in FIG. 1, is formed using the steps of thin film deposition, photolithography, and plasma etching known in the prior art. The gate structure shows semi-conductor substrate, preferably silicon substrate 10; gate dielectric 12, selected from the group of materials comprising silicon dioxide, silicon nitride, nitrided silicon dioxide, oxygen doped silicon nitride, dual gate materials such as silicon dioxide/silicon nitride, and/or high-k gate materials comprising $ZrO_2$, $HfO_2$, and/or other refractory metal oxides; conductor gate 14, selected from the group of materials comprising poly-silicon, doped poly-silicon, dual gates comprising poly-silicon/metal silicides, and/or metal gates; dielectric spacers 16, comprising silicon dioxide and silicon nitride. In the preferred embodiment of using silicon dioxide as gate dielectric film, the gate oxide is grown thermally to a thickness in the range of approximately between 10–25° A for a dual oxide or triple oxide process for thinner oxides and in the range of approximately between 20–70° A for thicker oxides. The oxide is then subjected to thermal nitridation in a nitrogen-containing atmosphere of gases comprising $NH_3$, NO, and/or $NO_2$ at a temperature range of approximately between 800–1000° C.

Figure 2:
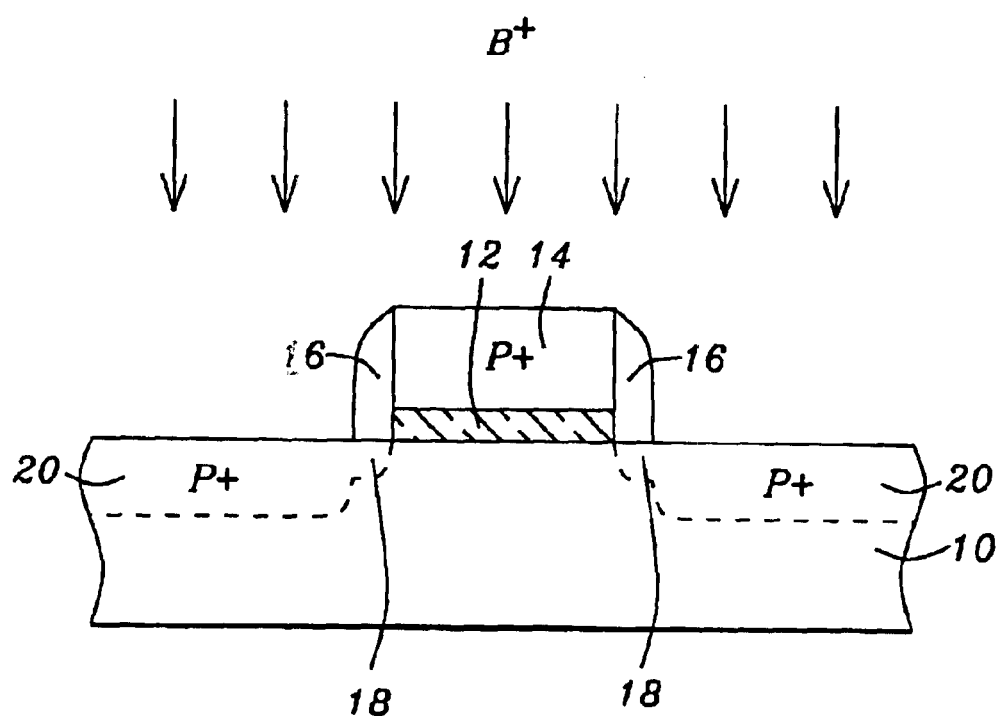
FIG. 2 is a cross sectional view of a semiconductor device, showing gate structure and implanted doped regions.

FIG. 2 shows the semiconductor device structure after boron ion implantation as per this invention. Heavy dose $B^+$ implant is used instead of the $BF_2^+$ implant known in prior art. Implant conditions are so chosen as to obtain desired dopant profile and depth. It is preferred that projected ion implant range is kept to less than the poly-silicon gate thickness so as to prevent doping the gate oxide. Ion implantation parameters are: dose range of approximately between 2E15–5E15 ions/cm², with a preferable dose of 4E15 ions/cm² and ion energy range of approximately between 2–6 KeV for 0.13 μm technology node (energy range depends upon the technology node), with a preferable energy of 4 KeV. For general technologies, the dose is approximately between 1E15–1E16 with energy range approximately between 1–20 KeV. Lightly doped $p^+$ regions 18 and heavily doped regions 20 are shown in the figure. The unique feature is that the poly-silicon gate 14 also gets simultaneously doped during this implant step.

The structure shown in FIG. 2 is then capped with a dielectric film 22, selected from the group of materials comprising films such as silicon dioxide, silicon nitride, nitrided silicon dioxide, and/or oxygen doped silicon nitride. The wafer is then annealed using rapid thermal annealing (RTA), known in prior art, to activate the $B^+$ implanted source/drain (S/D) regions. The cap dielectric film 22 prevents $B^+$ out-diffusion or segregation during the RTA step. As a consequence, the effective dose is thereby decreased raising the sheet resistance of S/D and decreasing the electrical thickness of the gate oxide. Thinner electrical oxide thickness improves the current drive through the gate oxide. Table showing experimental data of gate oxide thickness using the present invention as compared to that using prior art is given in FIG. 3.

Figures 3, 4:
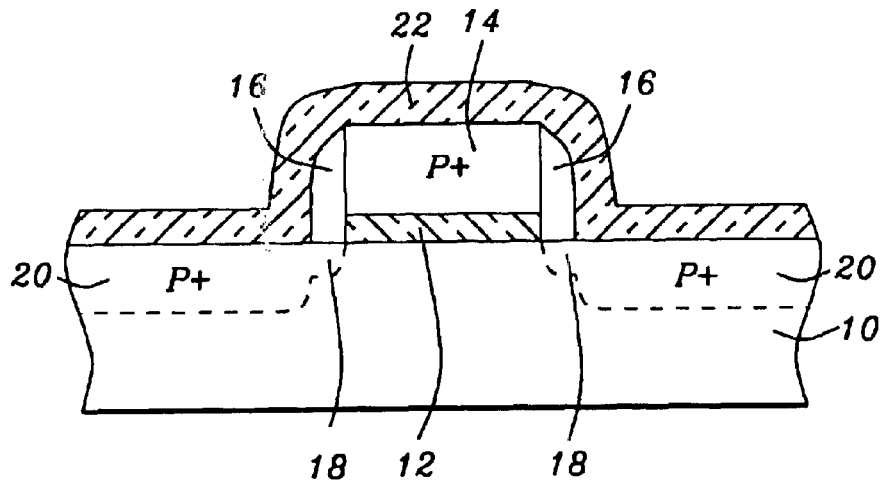
FIG. 3 is a table, comparing oxide thickness in the inversion and accumulation regions using prior art process flow and the invention process flow.
FIG. 4 is a cross sectional view of a semiconductor device, showing gate structure and deposited cap dielectric film.

A cap dielectric film 22 is then deposited over the semiconductor substrate, as is shown in FIG. 4. The cap dielectric film is selected from the groups of materials comprising silicon dioxide, silicon nitride, nitrided silicon dioxide, oxygen-doped nitride, and/or composite layers comprising oxide/nitride. The thickness of this cap film is kept to approximately between 100.degree. A-500.degree. A. Purpose of this cap dielectric film is to suppress boron ion penetration from the gate poly-silicon through the gate oxide during the high temperature RTA process discussed in the previous paragraph. It is to be noted the cap dielectric film is also used as a resist protective oxide (RPO) layer for ESD devices. A portion of the cap dielectric film such as RPO film for ESD devices is preserved over the ESD part of the chip while etching the cap dielectric film off from the main regions of the device to allow silicide electrical contacts to gate and S/D regions.

Figure 5:
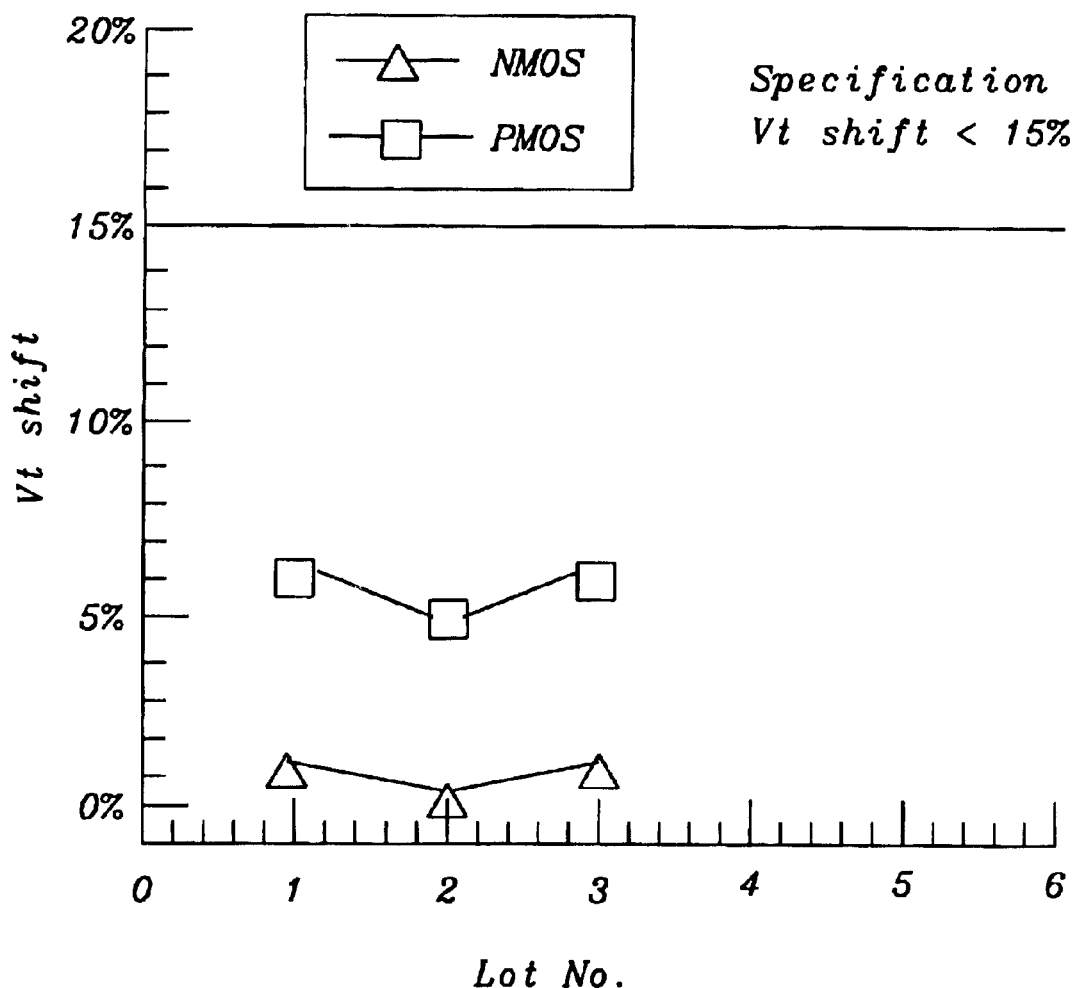
FIG. 5 is a graph showing $V_t$ shift for NMOS and PMOS devices fabricated using this invention.

Data of threshold voltage ($V_t$) stability of both NMOS and PMOS transistors with the present invention integration process flow are shown in FIG. 5. In spite of the heavy dose boron implant and high temperature RTA process, $V_t$ shifts are will within required specification values for both the transistor types. The $V_t$ shifts were obtained by measuring $V_t$ values before and after stressing at 150° C. and an applied voltage of 2.5+/–10% and computing the difference.

The advantages of this invention over prior art are:
a) New process integration method to activate $p^+$ gate in a CMOS device.
b) Simultaneous gate and S/D activation of $p^+$ dopant.
c) Enhanced $p^+$ gate activation with thinner gate oxide.
d) Gate oxide nitridation to suppress boron penetration during high temperature RTA dopant activation.
e) Cap dielectric layer is used prior to $p^+$ source/drain implant anneal to suppress boron out-diffusion or segregation; lowers effective dose.
f) Cap layer is also used as resist protective oxide to block silicidation in unwanted areas of the chip.
g) Electrical oxide thickness is reduced in the range of 3–4° A
h) Good $V_t$ stability for both IO and PMOS devices, indicating no boron penetration in the channel.

While the invention has been particularly shown and described with reference to the general embodiment and a specific application thereof, it will be understood by those skilled in the art that various changes in form and details to the method and applications may be made without departing from the concept, spirit, and the scope of the invention.

What is claimed is:

1. A method of forming $p^+$ poly-silicon gate on a semiconductor substrate comprising:

forming a gate dielectric layer on a semiconductor substrate having n-well region;

nitridizing said gate dielectric over said semiconductor substrate;

forming PMOS gate electrode over said n-well region;

implanting to form $p^+$ S/D regions in said n-well on both sides of said PMOS gate electrode;

forming a cap dielectric layer on said gate electrode and said semiconductor substrate;

annealing said semiconductor substrate;

etching said cap dielectric layer from main regions of said semiconductor substrate; and forming silicided electrical contacts in said main regions of said semiconductor substrate.

2. The method of forming $p^+$ poly-silicon gate on a semiconductor substrate according to claim 1, wherein said gate dielectric material is selected from the group comprising silicon dioxide, silicon nitride, nitrided silicon-dioxide, and oxygen doped silicon nitride, dual dielectric materials comprising silicon dioxide/silicon nitride, and high-k gate materials comprising $ZrO_2$, $HfO_2$, and other refractory metal oxides.

3. The method of forming $p^+$ poly-silicon gate on a semiconductor substrate according to claim 2, wherein said equivalent gate silicon dioxide thickness is approximately between 5 Å–25 Å; and the physical oxide thickness in the range of approximately between 13 Å–70 Å.

4. The method of forming $p^+$ poly-silicon gate on a semiconductor substrate according to claim 1, wherein said nitridizing is performed in a nitrogen-containing atmosphere of gases comprising $NH_3$, NO, or $NO_2$.

5. The method of forming $p^+$ poly-silicon gate on a semiconductor substrate according to claim 1, wherein said implanting is performed by ion implanting $B^+$ ions.

6. The method of forming $p^+$ poly-silicon gate on a semiconductor substrate according to claim 5, wherein said heavy dose $B^+$ ion implant simultaneously dopes both S/D regions and gate electrode.

7. The method of forming $p^+$ poly-silicon gate on a semiconductor substrate according to claim 5, wherein said $B^+$ ion dose is approximately between 1E15–1E16 ions/cm$^2$.

8. The method of forming $p^+$ poly-silicon gate on a semiconductor substrate according to claim 5, wherein said $B^+$ ion energy is approximately between 1–10 KeV.

9. The method of forming $p^+$ poly-silicon gate on a semiconductor substrate according to claim 1, wherein said cap dielectric material is comprised of silicon dioxide, silicon nitride, nitrided silicon-dioxide, oxygen-doped silicon nitride, and composite layers comprising silicon dioxide/silicon nitride.

10. The method of forming $p^+$ poly-silicon gate on a semiconductor substrate according to claim 9, wherein the thickness of said cap layer of silicon-dioxide is approximately between 100 and 500 Å.

11. The method of forming $p^+$ poly-silicon gate on a semiconductor substrate according to claim 1, wherein said annealing is done using high temperature rapid thermal process.

12. The method of forming $p^+$ poly-silicon gate on a semiconductor substrate according to claim 11, wherein said rapid thermal annealing is done at approximately between 800 and 1000° C.

13. A method of forming a CMOS device on a silicon substrate comprising:
   forming a gate oxide layer on a silicon substrate having p- and n-well regions;
   nitridizing said gate oxide layer;
   forming NMOS and PMOS gate electrodes over said p- and n-well regions;
   forming lightly doped regions and dielectric side-wall spacers on both sides of said gate electrode;
   implanting to form $n^+$ S/D regions in said p-well on both sides of said NMOS gate electrode;
   implanting to form $p^+$ S/D regions in said n-well on both sides of said PMOS gate electrode;
   forming a cap dielectric layer on said silicon substrate;
   annealing said silicon substrate;
   removing said cap dielectric layer from main regions of said silicon substrate; and
   forming silicided electrical contacts in said main regions of said silicon substrate.

14. The method according to claim 13, wherein said equivalent gate silicon dioxide thickness is approximately between 5 Å–25 Å.

15. The method according to claim 13, wherein said nitridizing is performed in a nitrogen-containing atmosphere of gases comprising $NH_3$, NO, and/or $NO_2$.

16. The method according to claim 13, wherein said implanting to form $p^+$ S/D regions is performed by ion implanting $B^+$ ions.

17. The method according to claim 16, wherein said heavy dose $B^+$ ion implant simultaneously dopes both S/D regions and gate electrode.

18. The method according to claim 16, wherein said $B^+$ ion dose is approximately between 1E15–1E16 ions/cm$^2$.

19. The method according to claim 16, wherein said $B^+$ ion energy is approximately between 1–10 KeV.

20. The method according to claim 13, wherein said cap dielectric material is selected from the group comprising silicon dioxide, silicon nitride, nitrided silicon-dioxide, oxygen-doped silicon nitride, and/or composite layers comprising silicon dioxide/silicon nitride.

21. The method according to claim 13, wherein the thickness of said cap silicon-dioxide is approximately between 100 and 500 Å.

22. The method according to claim 13, wherein said annealing is done using high temperature rapid thermal process at approximately between 800–1000° C.

23. A method of forming $p^+$ poly-silicon gate on a semiconductor substrate comprising:
   forming a nitridized gate dielectric layer on a semiconductor substrate, having n-well region;
   forming PMOS gate electrode over said n-well region;
   implanting to form $p^+$ S/D regions in said n-well on both sides of said PMOS gate electrode;
   forming a cap dielectric layer on said gate electrode and said semiconductor substrate; and
   annealing said semiconductor substrate.

24. The method of forming $p^+$ poly-silicon gate on a semiconductor substrate according to claim 23, wherein said gate dielectric material is selected from the group comprising silicon dioxide, silicon nitride, nitrided silicon-dioxide, and oxygen doped silicon nitride, dual dielectric materials comprising silicon dioxide/silicon nitride, and high-k gate materials comprising $ZrO_2$, $HfO_2$, and other refractory metal oxides.

25. The method of forming $p^+$ poly-silicon gate on a semiconductor substrate according to claim 24, wherein said equivalent gate silicon dioxide thickness is approximately between 5 Å–25 Å; and the physical oxide thickness in the range of approximately between 13 Å–70 Å.

26. The method of forming $p^+$ poly-silicon gate on a semiconductor substrate according to claim 23, wherein said nitridizing is performed in a nitrogen-containing atmosphere of gases comprising $NH_3$, NO, or $NO_2$.

27. The method of forming $p^+$ poly-silicon gate on a semiconductor substrate according to claim 23, wherein said implanting is performed by ion implanting $B^+$ ions; and wherein said heavy dose $B^+$ ion implant simultaneously dopes both S/D regions and gate electrode.

28. The method of forming $p^+$ poly-silicon gate on a semiconductor substrate according to claim 27, wherein said $B^+$ ion dose is approximately between 1E15–1E16 ions/cm$^2$.

29. The method of forming $p^+$ poly-silicon gate on a semiconductor substrate according to claim 27, wherein said $B^+$ ion energy is approximately between 1–10 KeV.

30. The method of forming p⁺ poly-silicon gate on a semiconductor substrate according to claim 23, wherein said cap dielectric material is comprised of silicon dioxide, silicon nitride, nitrided silicon-dioxide, oxygen-doped silicon nitride, and composite layers comprising silicon dioxide/silicon nitride.

31. The method of forming p⁺ poly-silicon gate on a semiconductor substrate according to claim 30, wherein the thickness of said cap layer of silicon-dioxide is approximately between 100 Å–500 Å.

32. The method of forming p⁺ poly-silicon gate on a semiconductor substrate according to claim 23, wherein said annealing for dopant activation is done using high temperature rapid thermal process.

33. The method of forming p⁺ poly-silicon gate on a semiconductor substrate according to claim 32, wherein said rapid thermal annealing is done at approximately between 800 and 1000° C.

* * * * *